United States Patent
Keskin et al.

(10) Patent No.: US 12,405,915 B2
(45) Date of Patent: Sep. 2, 2025

(54) WAVEFORM-AWARE MIXED SIGNAL MEASUREMENT SYSTEM FOR BUS TRAFFIC REDUCTION IN SYSTEM-ON-A-CHIP DEVICES

(71) Applicant: QUALCOMM Incorporated, San Diego, CA (US)

(72) Inventors: Mustafa Keskin, San Diego, CA (US); Guoqing Miao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 249 days.

(21) Appl. No.: 18/464,136

(22) Filed: Sep. 8, 2023

(65) Prior Publication Data

US 2025/0086138 A1    Mar. 13, 2025

(51) Int. Cl.
*H03M 1/12*    (2006.01)
*G01R 31/317*    (2006.01)
*G06F 1/3296*    (2019.01)
*G06F 15/78*    (2006.01)

(52) U.S. Cl.
CPC ..... *G06F 15/781* (2013.01); *G01R 31/31721* (2013.01); *G06F 1/3296* (2013.01); *H03M 1/121* (2013.01); *G06F 2213/0038* (2013.01)

(58) Field of Classification Search
CPC ..... G06F 15/781; G06F 1/3296; H03M 1/121
USPC .................................................. 341/155, 120
See application file for complete search history.

(56) References Cited

U.S. PATENT DOCUMENTS

| | | | |
|---|---|---|---|
| 7,382,300 B1 * | 6/2008 | Nanda | H03M 3/346 |
| | | | 341/143 |
| 7,515,076 B1 * | 4/2009 | Singh | H03M 3/376 |
| | | | 341/122 |
| 2015/0220131 A1 | 8/2015 | Johansson et al. | |
| 2019/0187776 A1 | 6/2019 | Mukherjee et al. | |
| 2020/0285287 A1 | 9/2020 | Han et al. | |

OTHER PUBLICATIONS

International Search Report and Written Opinion—PCT/US2024/037664—ISA/EPO—Nov. 11, 2024.

* cited by examiner

*Primary Examiner* — Peguy Jean Pierre
(74) *Attorney, Agent, or Firm* — Seyfarth Shaw LLP

(57) ABSTRACT

A processor-implemented method for managing bus traffic of a system-on-a-chip (SoC) includes receiving a mixed signal in a computing device including the SoC. One or more polarity changes of a slope of a waveform corresponding to the mixed signal are detected. One or more of an analog-to-digital converter (ADC) or a portion of SoC bus traffic related to ADC operation are selectively disabled between one or more polarity changes in the slope of the waveform.

28 Claims, 11 Drawing Sheets

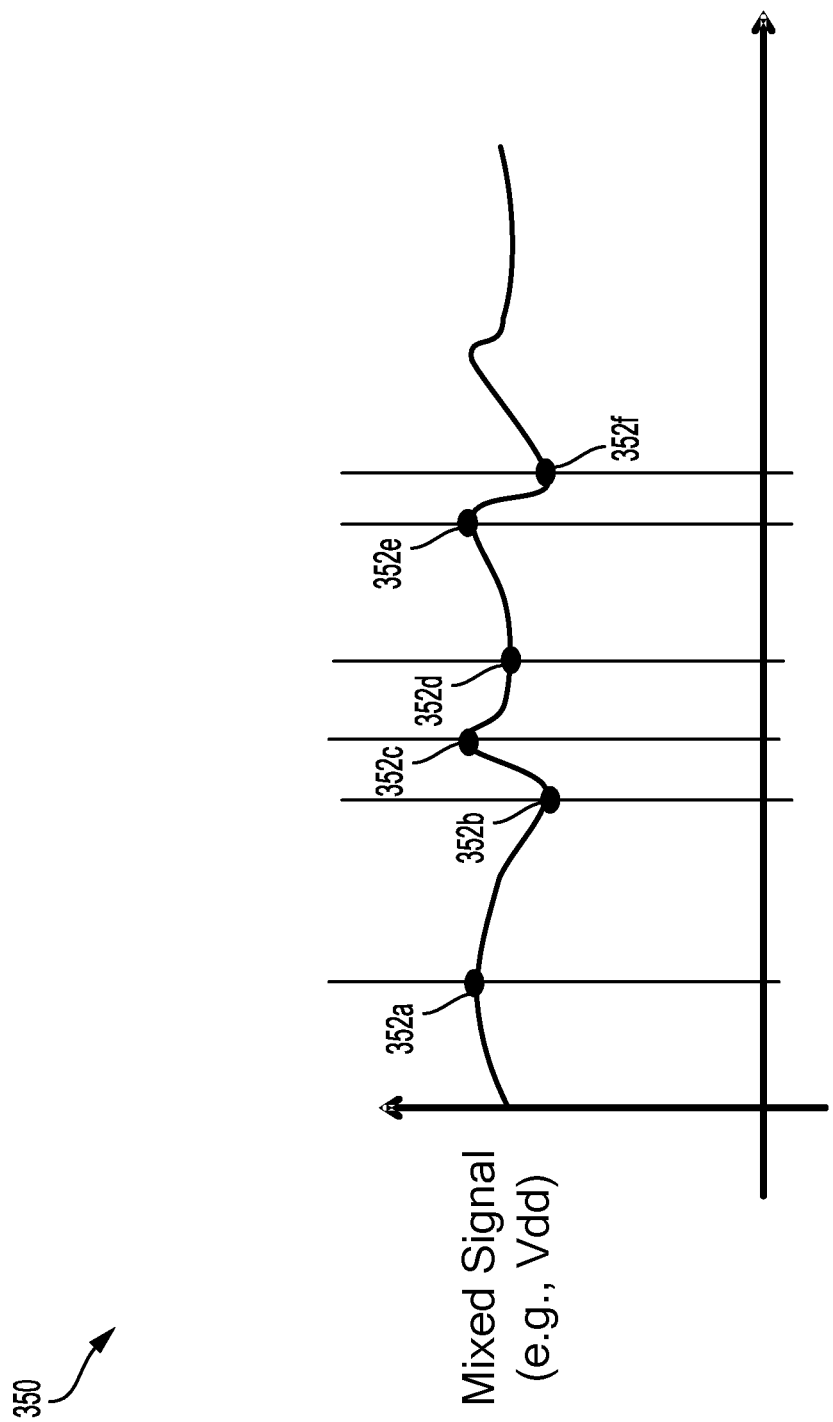

WAVEFORM-AWARE MIXED SIGNAL MEASUREMENT SYSTEM FOR BUS TRAFFIC REDUCTION IN SYSTEM-ON-A-CHIP DEVICES

BACKGROUND

Field

Aspects of the present disclosure relate to computing devices, and more specifically to a power optimized and waveform-aware mixed signal measurement system for bus traffic reduction in system-on-a-chip (SoC) devices.

Background

Mobile or portable computing devices include mobile phones, laptop, palmtop and tablet computers, portable digital assistants (PDAs), portable game consoles, and other portable electronic devices. Mobile computing devices are comprised of many electrical components that consume power and generate heat. The components (or compute devices) may include system-on-a-chip (SoC) devices, graphics processing unit (GPU) devices, neural processing unit (NPU) devices, digital signal processors (DSPs), and modems, among others.

Measurement and monitoring of power and thermal conditions for mobile computing devices and in automotive applications are important for reducing safety issues. Power, thermal, and sensor parameters of SoC devices may be periodically monitored on-chip and off-chip for auxiliary chipsets. However, such measurements and monitoring may create large sparsity in data collection as well as additional traffic and thermal and power dissipation on SoC buses, which may hinder SoC performance.

SUMMARY

In some aspects of the present disclosure, a processor-implemented method includes receiving a mixed signal in a computing device including a system-on-a-chip (SoC). The processor-implemented method further includes detecting one or more polarity changes of a slope of a waveform corresponding to the mixed signal. The processor-implemented method also includes selectively disabling one or more of an analog-to-digital converter (ADC) or at least a portion of SoC bus traffic related to ADC operation between one or more polarity changes in the slope of the waveform.

Various aspects of the present disclosure are directed to an apparatus including means for receiving a mixed signal in a computing device including a system-on-a-chip (SoC). The apparatus further includes means for detecting one or more polarity changes of a slope of a waveform corresponding to the mixed signal. The apparatus further includes means for selectively disabling one or more of an analog-to-digital converter (ADC) or at least a portion of SoC bus traffic related to ADC operation between one or more polarity changes in the slope of the waveform.

In some aspects of the present disclosure, a non-transitory computer-readable medium with non-transitory program code recorded thereon is disclosed. The program code is executed by a processor and includes program code to receive a mixed signal in a computing device including a system-on-a-chip (SoC). The program code also includes program code to detect one or more polarity changes of a slope of a waveform corresponding to the mixed signal. The program code further includes program code to selectively disable one or more of an analog-to-digital converter (ADC) or at least a portion of SoC bus traffic related to ADC operation between one or more polarity changes in the slope of the waveform.

Various aspects of the present disclosure are directed to a system for mixed signal management. The system includes a detection device for detecting one or more polarity changes in a slope of a waveform corresponding to one or more mixed signal in a computing device including a system-on-a-chip (SoC). The system also includes a mixed signal controller for controlling SoC bus traffic or an analog-to-digital converter (ADC) based on the one or more polarity changes of the slope of the waveform corresponding to one or more mixed signals.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 3B is a graph illustrating an example waveform of the power supply voltage Vdd, in accordance with various aspects of the present disclosure.

DETAILED DESCRIPTION

Figure 1:
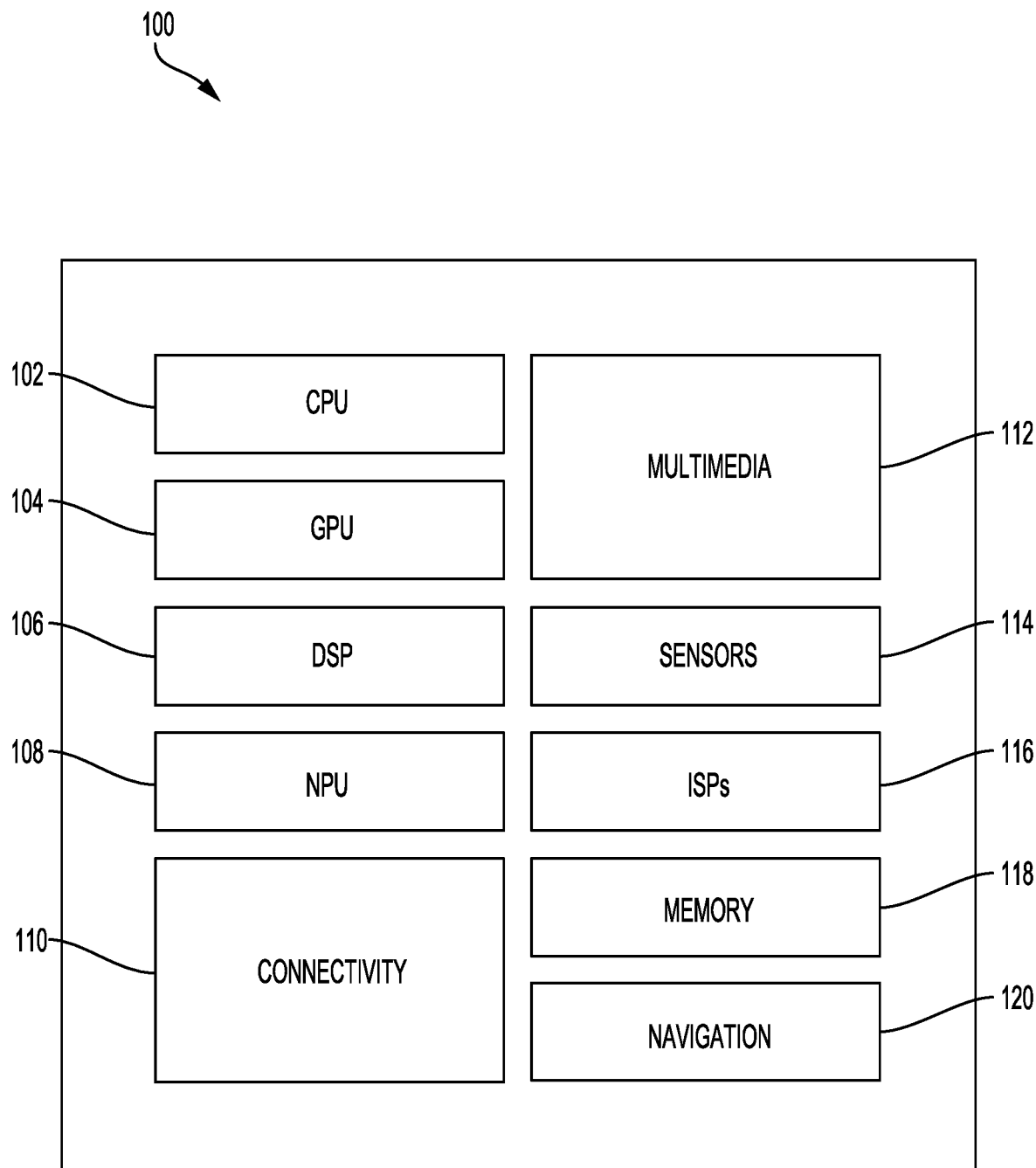
FIG. 1 illustrates an example implementation of a host system-on-a-chip (SoC), including a mixed signal waveform-aware measurement system, in accordance with certain aspects of the present disclosure.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR," and the use of the term "or" is intended to represent an "exclusive OR." As described, the term "exemplary" used throughout this description means "serving as an example, instance, or illustration," and should not necessarily be construed as preferred or advantageous over other exemplary configurations. As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described, the term "proximate" used throughout this description means "adjacent, very near, next to, or close to." As described, the term "on" used throughout this description means "directly on" in some configurations, and "indirectly on" in other configurations.

As described, measurement and monitoring of power and thermal conditions for mobile computing devices and in automotive applications are important for reducing safety issues. Power, thermal, and sensor parameters of SoC devices may be periodically monitored on-chip and off-chip for auxiliary chipsets. For example, digital power meters, current sensors, housekeeping analog-to-digital converters (ADCs), and other sensors and monitoring devices may be employed in conjunction with SoCs, application-specific integrated circuits (ASICs) or associated power management integrated circuit (PMIC) devices.

A single ADC may be used with a multiplexor (MUX) to periodically sample and monitor internal on-chip current and voltage sensor outputs as well as off-chip parameters. The ADC uses the MUX to periodically sample multiple inputs in different time slots. However, sporadically high activity for a supply rail may be challenging for a single ADC to manage.

In automotive applications, the bus traffic of the SoC may be further increased for safety and SoC power measurements. For example, automotive integrated circuits (ICs) may have extensive testing and safety features such as error correction and triple modular redundancy. Furthermore, automotive ICs may include real time monitoring of regulator output voltage, current, and temperature as well as watchdog timers, frequency monitors, and built-in self-tests (BISTs) for various subsystems for power on or other safety checks.

Conventional approaches to address the sporadic activities may involve increasing a clock frequency. However, increasing the clock frequency may significantly increase power and thermal dissipation on SoC buses and constrain ADC specifications.

Additionally, if a sensor is idle, regular sampling may result in inefficiency and may create large sparsity in data collection as well as additional traffic. That is, the ADC may inefficiently oversample some of the idle sensor parameters and create superfluous or redundant traffic, and may also result in increased power dissipation for data transfer between advanced driver assistance system (ADAS) devices and edge/cloud systems.

Accordingly, aspects of the present disclosure are directed to an intelligent data collection and measurement system for the SoC and associated subsystems. In various aspects, a waveform-aware mixed signal measurement system is presented. Changes in mixed signal waveforms may be monitored and utilized for regulating SoC bus traffic.

Particular aspects of the subject matter described in this disclosure can be implemented to realize one or more of the following potential advantages. In some examples, the described techniques may enable SoC bus traffic reduction as well as thermal and power dissipation.

FIG. 1 illustrates an example implementation of a host system-on-a-chip (SoC) 100, which includes a mixed signal waveform-aware measurement system, in accordance with various aspects of the present disclosure. The host SoC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, universal serial bus (USB) connectivity, Bluetooth® connectivity, Secure Digital (SD) connectivity, and the like.

In this configuration, the host SoC 100 includes various processing units that support multi-threaded operation. For the configuration shown in FIG. 1, the host SoC 100 includes a multi-core central processing unit (CPU) 102, a graphics processor unit (GPU) 104, a digital signal processor (DSP) 106, and a neural processor unit (NPU) 108. The host SoC 100 may also include a sensor processor 114, image signal processors (ISPs) 116, a navigation module 120, which may include a global positioning system (GPS), and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

Figure 2:
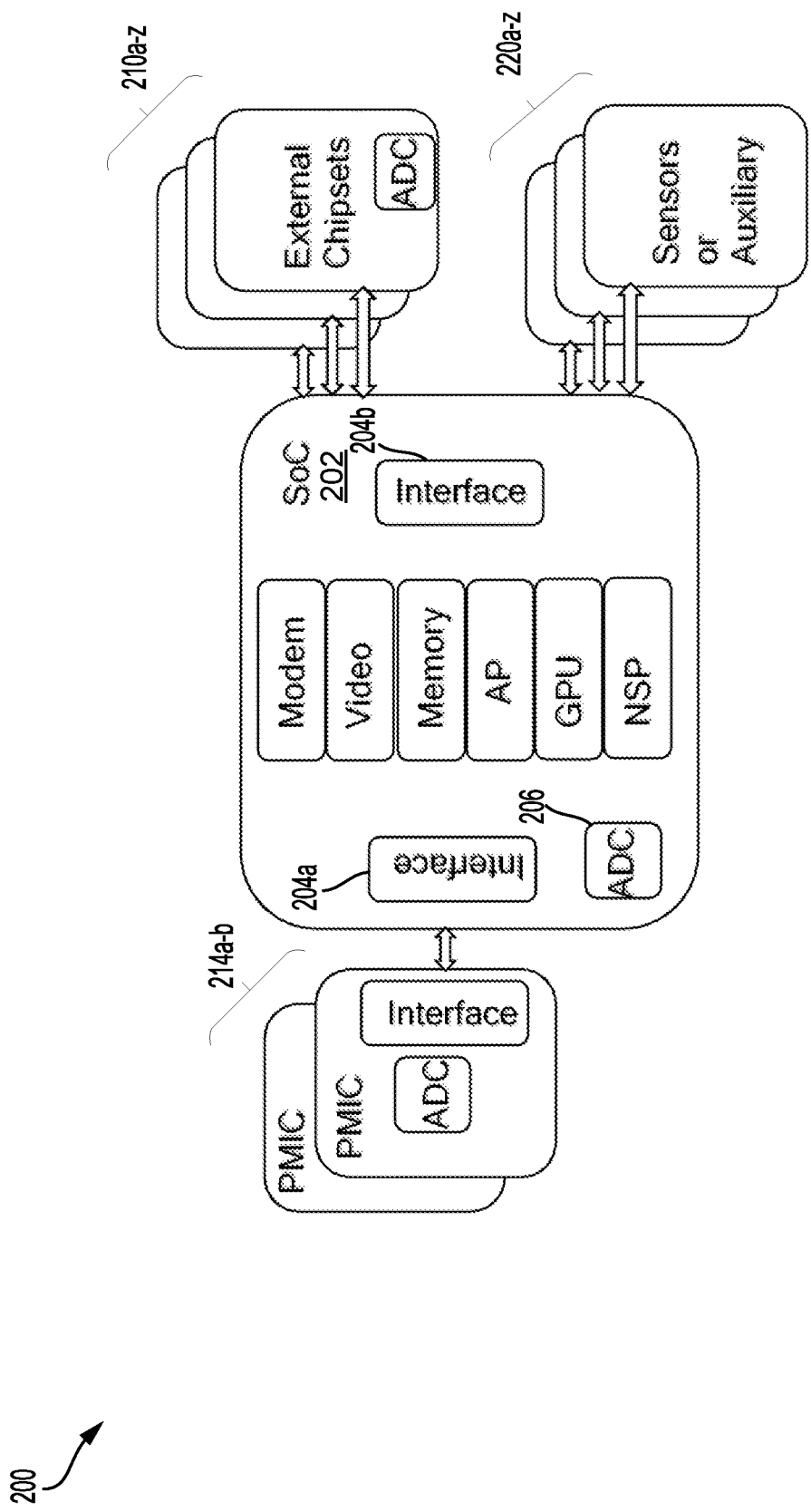
FIG. 2 is a block diagram illustrating an example computing system in accordance with various aspects of the present disclosure.

FIG. 2 is a block diagram illustrating an example computing system 200, in accordance with various aspects of the present disclosure. As shown in FIG. 2, the example computing system 200 may include the host SoC 202. The host SoC 202 may include similar components and function similar to SoC 100 (FIGURE). As shown in FIG. 2, the host SoC 202 includes interface circuitry 204*a-b* and an ADC 206. The interface circuitry 204*a-b* may provide connectivity to one or more power management integrated circuits (PMICs) 214*a-b*. In addition, the interface circuitry may provide connectivity to one or more external chipsets 210*a-z* as well as external sensors or auxiliary integrated circuit devices 220a-z. In some aspects, the external chipsets 210a-z may for example include additional processors, such as one or more external GPUs 210 or one or more wireless communication devices that may facilitate communication such as 5G, 6G, vehicle—to everything communication (V2X), wireless local area network (WLAN), and the like. Moreover, in various aspects, the external chipsets 210a-z may, for example, relate to vehicle control and safety systems.

The sensors/auxiliary IC devices 220a-z may power sensors (e.g., digital power meters), thermal sensors, current sensors, voltage sensors, transmit power level sensors, The SoC 202 may include a single ADC 206. The ADC 206 may periodically sample and monitor mixed signal such as internal on-chip current sensor and voltage sensor outputs. Additionally, the ADC 206 may periodically sample and monitor off-chip parameters such as sensor output parameters associated with the sensor/auxiliary IC devices 220a-z. In an example, the ADC 206 may receive an analog voltage signal (e.g., through the interface circuitry 204a) from a power supply (e.g., PMIC 214a-b), for example. The ADC 206 may digitally encode the analog signal to convert the analog voltage signal to a digital output. The ADC 206 may include both analog and digital circuits and thus, may be considered a mixed-signal integrated circuit. In some aspects, the ADC 206 may also convert other analog signal supplied to the computing system 200 to a digital output. For instance, the ADC 206 may convert analog signals from sensors (e.g., 114 of FIG. 1 or sensors/auxiliary IC devices 220a-z) such as temperature sensors, light sensors, sonar signal, video signals, gyroscope sensors and the like.

The ADC 206 may distribute the digital output to digital components of the computing system 200 using a bus transfer protocol such as the advanced microcontroller bus architecture (AMBA) advanced high-performance bus (AHB) protocol, for example. As such, when the ADC 206 performs an operation to convert an analog signal to a digital output and distributes the output to another component of the computing system 200, the ADC 206 may contribute to bus traffic for the SoC 100.

Figure 3A:
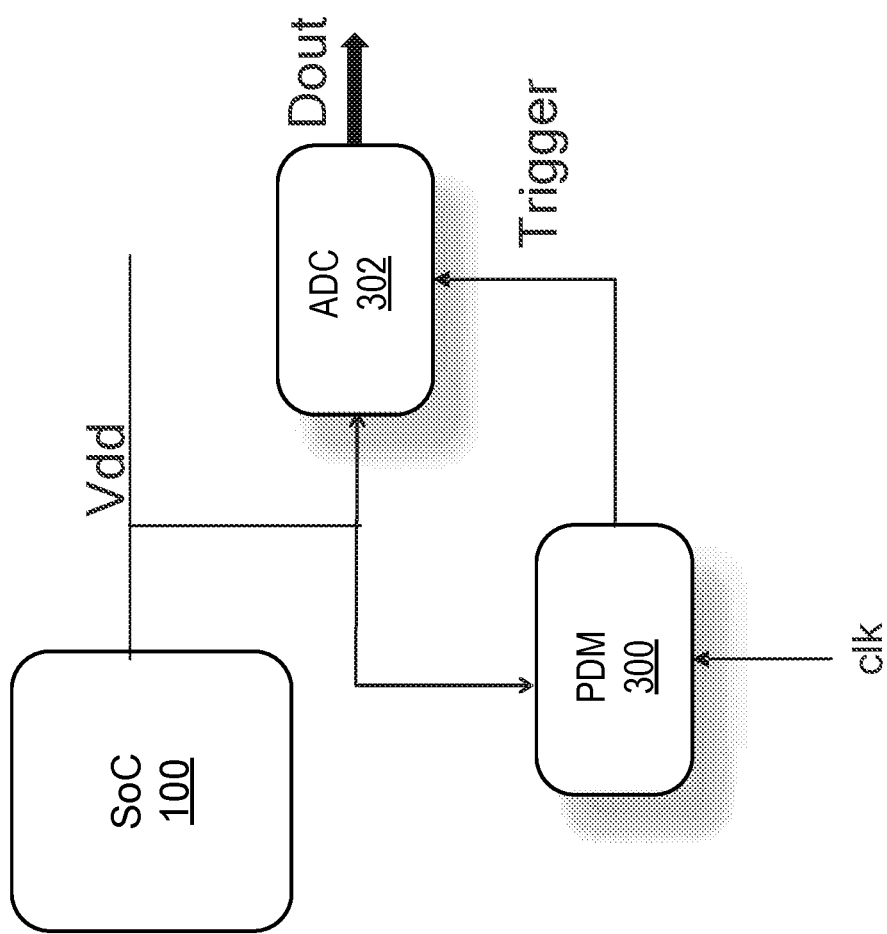
FIG. 3A is a is a block diagram illustrating a mixed signal peak and dip monitor (PDM), in accordance with various aspects of the present disclosure.

FIG. 3A is a block diagram illustrating a mixed signal peak and dip monitor (PDM) 300, in accordance with various aspects of the present disclosure. Referring to FIG. 3A, the PDM 300 may be coupled to an ADC 302, a host SoC (e.g., 100 or 202) and a power supply voltage Vdd. The ADC 302 has a similar configuration to the ADC 206 of FIG. 2 and may function in a manner similar to that of the ADC 206.

The PDM 300 may monitor the power supply voltage Vdd (or other mixed signals). For example, the PDM 300 may monitor the power supply voltage for a drop in the voltage or an overshoot condition. Periodic signaling (e.g., power conversions and related signals) by the ADC 302 may overburden the memory and/or result in significant power consumption.

In various aspects of the present disclosure, the PDM 300 may monitor the power supply voltage Vdd or other mixed signals on a periodic or aperiodic basis. The PDM 300 may monitor the polarity of the slope of the waveform for the power supply voltage Vdd. Rather than permitting repeated signaling by the ADC 302 as a result of voltage transition, the PDM 300 may send a signal to the ADC 302 to trigger the ADC 302 to control signaling based on timings of peaks and dips of the power supply voltage waveform. For instance, the PDM 300 signal may trigger the ADC 302 to stop analog to digital conversion operations related to the monitored waveform (e.g., power supply voltage signal). Moreover, in various aspects, the PDM 300 signal may trigger the ADC 302 to reduce and, in some aspects, stop downstream bus traffic related to the monitored waveform.

Although, the example of FIG. 3A describes monitoring in relation to the power supply voltage Vdd, the present disclosure is not so limited and the PDM 300 may monitor any other mixed signal. Furthermore, although FIG. 3A, includes one PDM 300, it should be understood, that multiple PDMs may also be included in a computing system (e.g., 200). For instance, multiple PDMs (e.g., 300) may respectively monitor different mixed signal and/or sensor parameters of the compute system (e.g., 200) and manage related ADC operations or bus traffic for the monitored mixed signal.

FIG. 3B is a graph illustrating an example waveform 350 of the power supply voltage Vdd, in accordance with various aspects of the present disclosure. As shown in FIG. 3B, the waveform 350 of the power supply voltage Vdd may be an aperiodic signal with numerous changes in the polarity of the slope. Points 352a-f may indicate a change in the polarity of the slope of the power supply voltage Vdd waveform 350. When the PDM 300 detects a change in the polarity of the slope, such as a peak (e.g., 352a, 352c, and 352e) or a dip (e.g., 352b, 352d, and 352f), the PDM 300 may send a signal to the ADC 302 to enable the ADC 302 to perform the power conversions and related signaling. That is, the ADC 302 may receive the power supply voltage Vdd and perform the power conversions for the respective devices of the computing system (e.g., 200 of FIG. 2), for instance. Otherwise, the PDM 300 may instruct the ADC 302 to skip such power conversions or related signaling.

Figure 3C:
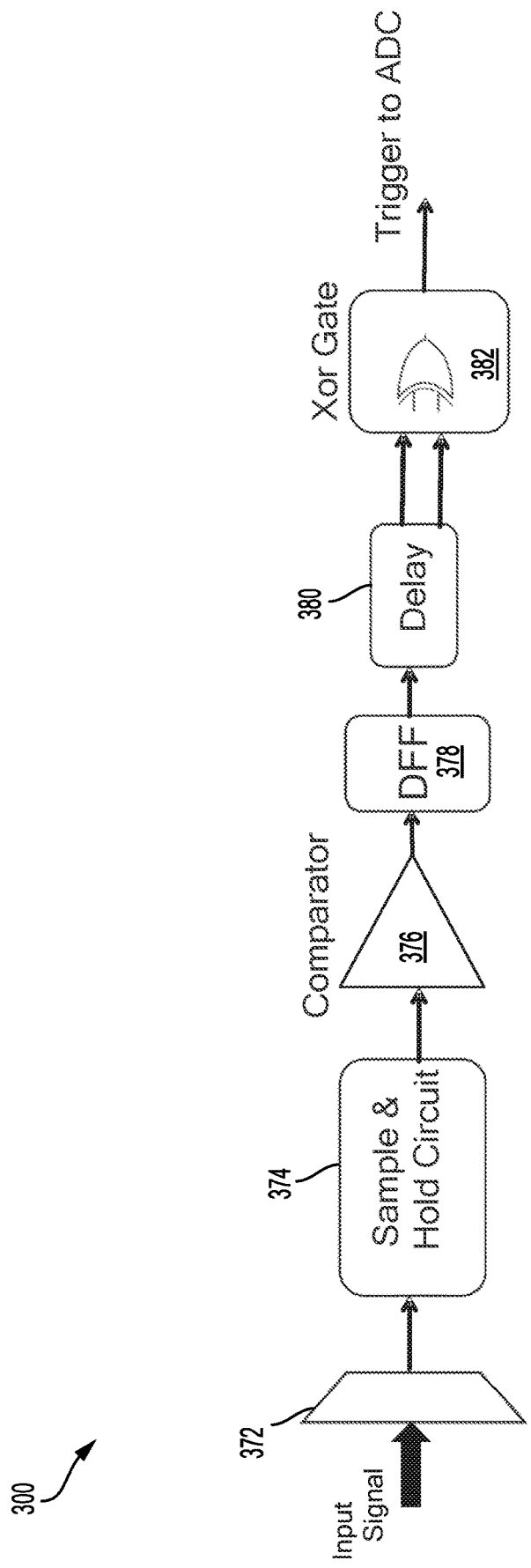
FIG. 3C is a diagram illustrating an example architecture of the peak and dip monitor (PDM), in accordance with various aspects of the present disclosure.

FIG. 3C is a diagram illustrating an example architecture of the peak and dip monitor (PDM) 300, in accordance with various aspects of the present disclosure. Referring to FIG. 3C, the example PDM 300 may include a multiplexer 372, a sample and hold circuit 374, a comparator 376, a D-flip flop (DFF) 378, a delay circuit 380 and an exclusive-or (XOR) gate 382.

The PDM 300 may receive an input signal. The input signal may comprise a mixed signal. The mixed signal may include (but is not limited to) a power supply voltage signal (Vdd), a sensor signal (e.g., current sensor, temperature sensor)), or other mixed signal. The sample and hold circuit 374 may sample an input signal which may be a continuously varying analog signal. The sample and hold circuit 374 may hold or fix the value of the input signal at a constant level for a predefined time period. For instance, the input signal may comprise (but is not limited to) the power supply voltage Vdd. The sample and hold circuit 374 may sample the power supply voltage Vdd at times n−2 and n−1. The sampled power supply voltages (Vdd) at time n−2 and at time n−1 may be supplied to the comparator 376.

The comparator 376 may compare the power supply voltages Vdd (n−2) and Vdd (n−1) at time n. The comparator 376 may generate an output to indicate whether the power supply voltage Vdd(n−2) is greater than Vdd(n−1). If the power supply voltage Vdd(n−2) is less than the Vdd(n−1) the peak of the waveform of the power supply voltage Vdd may not have been reached (e.g., if both values are positive). On the other hand, if the power supply voltage Vdd(n−2) is greater than the Vdd(n−1), the peak of the waveform of the power supply voltage Vdd may have been reached (e.g., if both values are positive) and the polarity of the slope of the waveform of the power supply voltage Vdd may have changed.

The output of the comparator 376 may be supplied to the DFF 378. In turn, the DFF 378 delay circuit 380 and XOR gate 382 extract peak to dip change or dip to peak polarity change in the waveform of the input signal (e.g., Vdd). The DFF 378 stores the output of the comparator 376. The comparator output at time n may be supplied to the delay circuit 380 to generate a delayed output. The delayed comparator output (e.g., comparator output at time n−1) and the current comparator output (e.g., comparator output at time n) may be supplied to the XOR gate 382.

The XOR gate 382 may compare the current comparator output (e.g., comparator output at time n) to the delayed comparator output (e.g., comparator output at time n−1) to generate a trigger signal. For example, if the current comparator output (e.g., at time n) is different than the delayed comparator output (e.g., at time n−1) then XOR gate 382 may output a 1 to indicate that polarity of the slope of the waveform of the input signal (e.g., Vdd) has changed. On the other hand, if the current comparator output (e.g., at time n) is the same as the delayed comparator output (e.g., time n−1), then XOR gate may output a 0 to indicate that polarity of the slope of the waveform of the input signal (e.g., Vdd) has not changed. If the XOR gate 382 output may be a trigger signal to control operation of the ADC (e.g., 302). For instance, if the XOR gate 382 outputs a 1, a trigger signal may be generated to enable operation of the ADC (e.g., 302). Conversely, if the if a XOR gate 382 outputs a 0, a trigger signal may not be generated and the ADC (e.g., 302) operation or bus traffic related to the input signal may be disabled.

Figure 4:
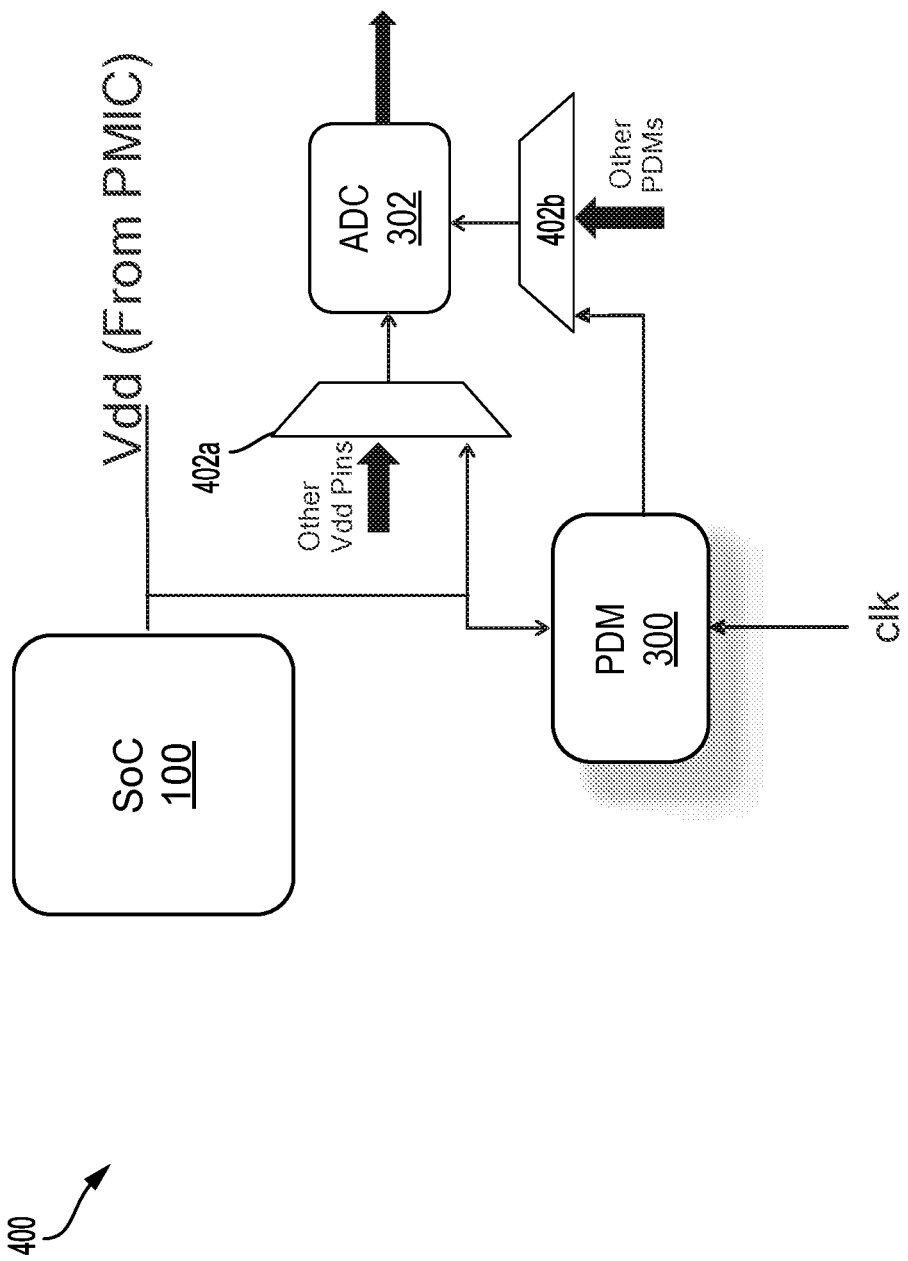
FIG. 4 is a block diagram illustrating an example system for bus traffic reduction including the PDM of FIG. 3A, in accordance with various aspects of the present disclosure.

FIG. 4 is a block diagram illustrating an example system 400 for bus traffic reduction including the PDM 300 of FIG. 3A, in accordance with various aspects of the present disclosure. Referring to FIG. 4, the PDM 300 may be coupled to the ADC 302 via multiplexors (MUXes) 402a and 402b. As described, the PDM 300 may monitor the power supply voltage Vdd for a drop in the voltage or an overshoot condition, for example. However, by including MUXes 402a and 402b, the PDM 300 may more narrowly tailor the limitation on ADC conversions. That is, using MUXes 402a and 402b, the PDM 300 may selectively limit ADC conversion and/or related signaling to some blocks while allowing periodic signaling to others. For instance, the PDM 300 may beneficially enable such power conversions related to certain automotive safety systems between the polarity changes, while limiting similar power conversions for other systems for the computing system (e.g. 200).

Additionally, as shown in the example of FIG. 4, other PDMs may be included for monitoring other mixed signal inputs (e.g., sensors outputs, battery level, temperature sensor, or current sensors). The outputs of such additional PDMs may be supplied to MUX 402b to trigger operation of ADC with respect to a corresponding one of the respective mixed signal inputs.

Figure 5:
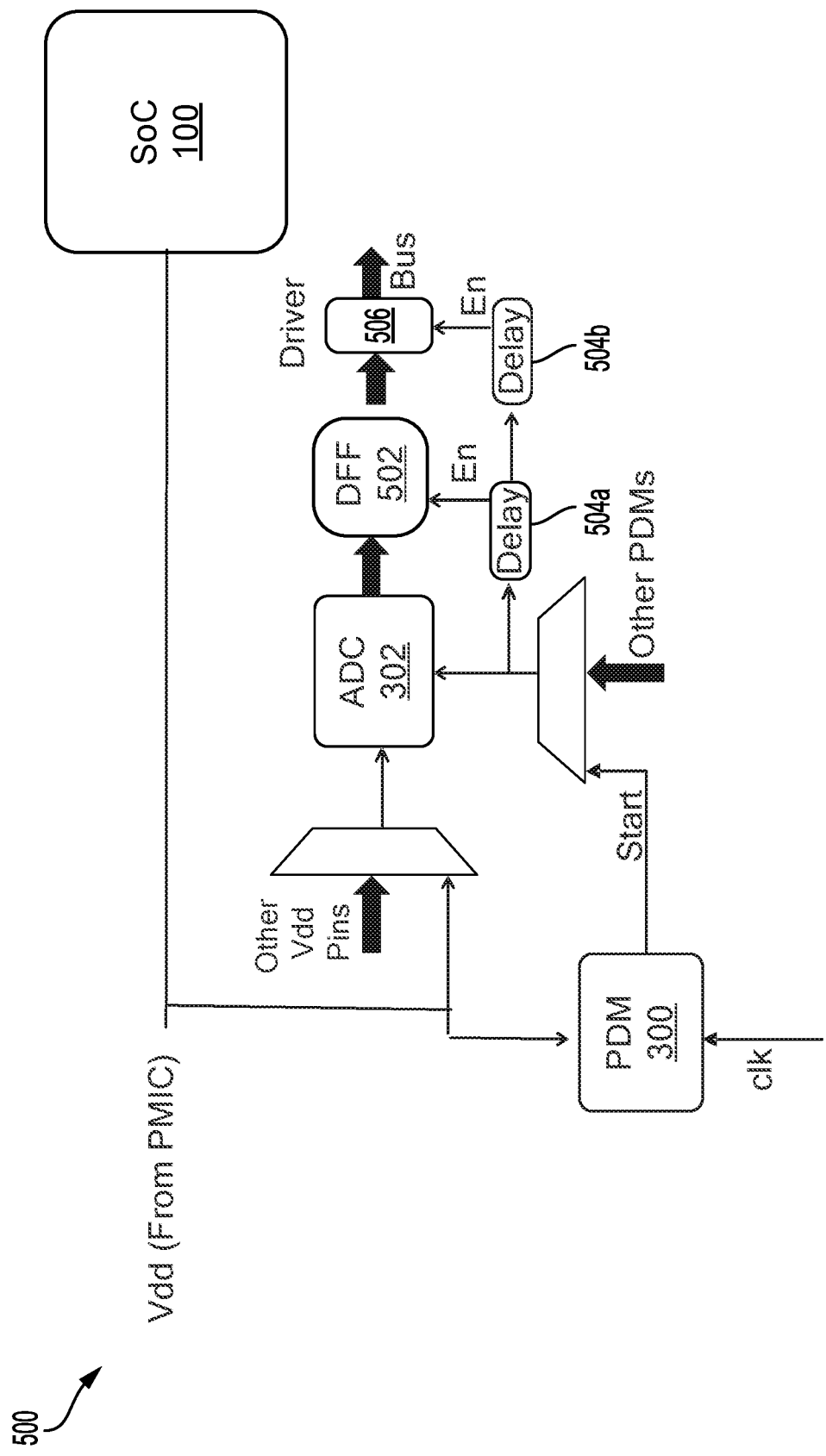
FIG. 5 is a block diagram illustrating an example system for bus traffic reduction including the PDM of FIG. 3A, in accordance with various aspects of the present disclosure.

FIG. 5 is a block diagram illustrating an example system 500 for bus traffic reduction including the PDM 300 of FIG. 3A, in accordance with various aspects of the present disclosure. The example system 500 includes elements shown in FIG. 4. However, as shown in FIG. 5, the example system 500 for bus traffic reduction may further include delay elements 504a and 504b. The delay elements 504a and 504b may operate under the control of the PDM 300. For example, during periods between polarity changes, the PDM 300 may limit (e.g., disable) the ADC 302 from making some power conversions. In addition, the PDM 300 may control the delay elements to disable a DFF 502 and driver 506 from transmitting related signals to the bus of the SoC 100, thereby reducing SoC bus traffic. Moreover, the DFF 502 and the delay elements 504 may synchronize data with clock/enable (EN) to reduce, and in some aspects, eliminate glitches and improve ADC performance.

Figure 6:
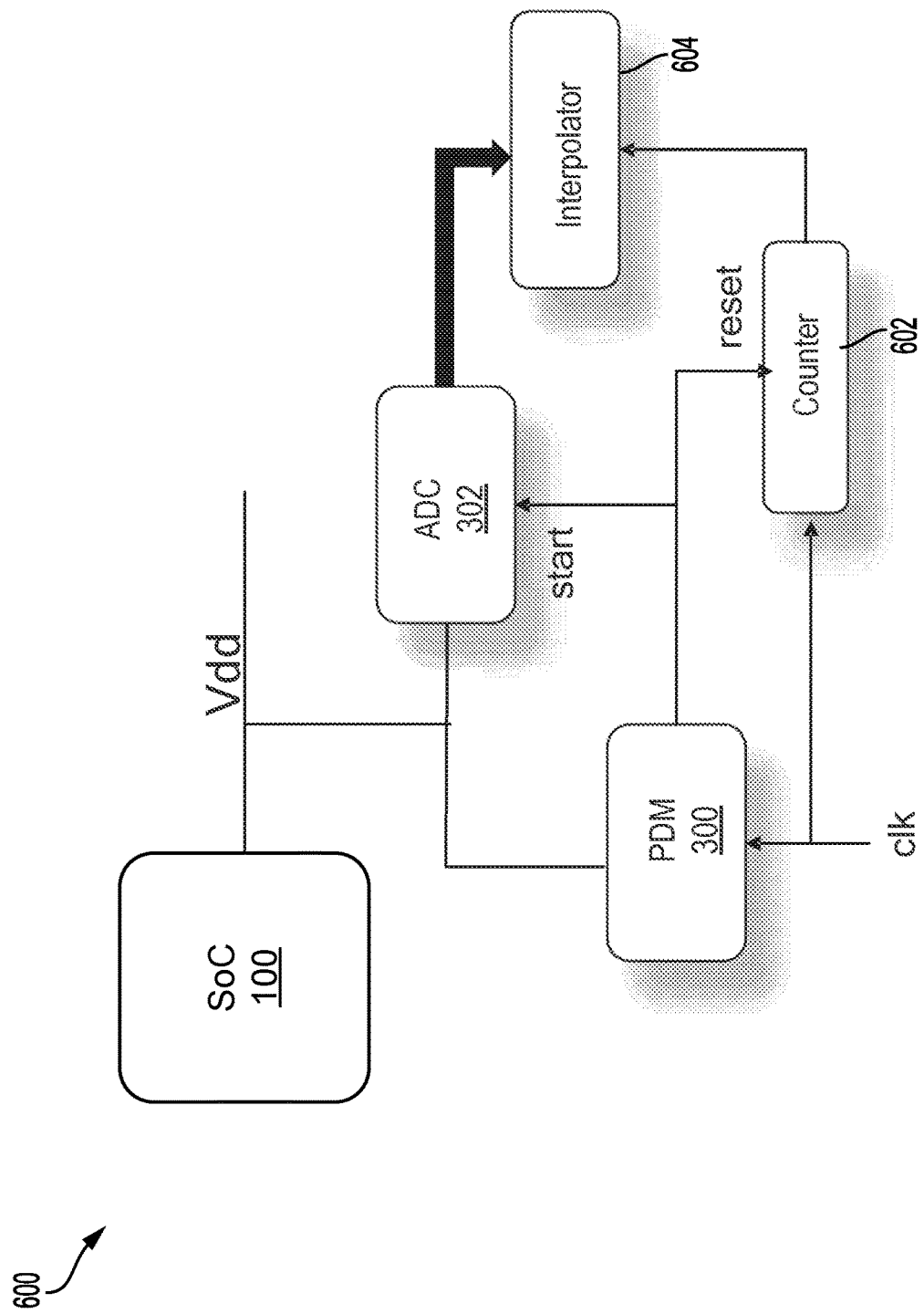
FIG. 6 is a block diagram illustrating an example system for bus traffic reduction including the PDM of FIG. 3A, in accordance with various aspects of the present disclosure.

FIG. 6 is a block diagram illustrating an example system 600 for bus traffic reduction including the PDM 300 of FIG. 3A, in accordance with various aspects of the present disclosure. The example system 600 includes elements shown in FIG. 4. However, as shown in FIG. 6, the example system 600 for bus traffic reduction may further include a counter 602 and an interpolator 604. In some aspects, the slope of the power supply waveform Vdd may be important for certain applications (e.g., automotive safety applications). To provide such information, the counter 602 may count the time period (e.g., clock cycles) between polarity changes. The counter 602 may then be reset when a polarity change occurs. The counter 602 count may indicate the number of clock cycles in between polarity changes (e.g., a peak and a dip). The count indicated by the counter 602 may be used to calculate the slope of the waveform.

Because the ADC may provide exact values of the peak and/or following dip, by determining the count, the waveform between the peak and the dip may be linearly reconstructed.

Figure 7:
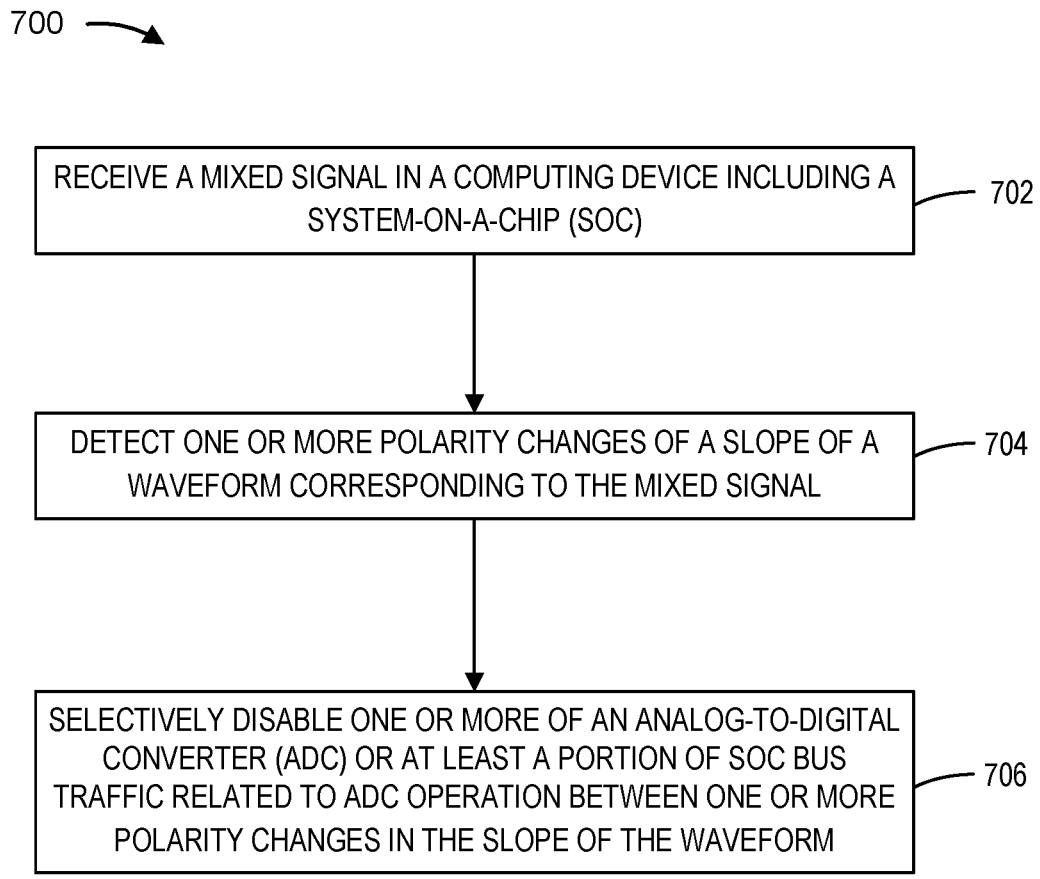
FIG. 7 is a flow diagram illustrating an example process performed, for example, by a processor of waveform-aware mixed signal measurement for bus traffic reduction, in accordance with various aspects of the present disclosure.

FIG. 7 is a flow diagram illustrating an example process 700 performed, for example, by a processor, in accordance with various aspects of the present disclosure. The example process 700 is an example of waveform-aware mixed signal measurement for bus traffic reduction.

As shown in FIG. 7, at block 702, the processor may receive a mixed signal in a computing device including a system-on-a-chip (SoC). For instance, as described with reference to FIG. 3C, the PDM 300 may receive an input signal. The input signal may comprise a mixed signal. The mixed signal may include (but is not limited to) a power supply voltage signal (Vdd), a sensor signal (e.g., current sensor, temperature sensor)), or other mixed signal.

At block 704, the processor detects one or more polarity changes of a slope of a waveform corresponding to the mixed signal. For example, as described with reference to FIG. 3C, the comparator 376 may compare the power supply voltages Vdd (n−2) and Vdd (n−1) at time n. The comparator 376 may generate an output to indicate whether the power supply voltage Vdd(n−2) is greater than Vdd(n−1). The output of the comparator 376 may be supplied to the DFF 378. In turn, the DFF 378 delay circuit 380 and XOR gate 382 extract peak to dip change or dip to peak polarity change in the waveform of the input signal (e.g., Vdd).

At block 706, the processor selectively disables one or more of an analog-to-digital converter (ADC) or at least a portion of SoC bus traffic related to ADC operation between one or more polarity changes in the slope of the waveform. For example, as described with reference to FIG. 3C, the comparator output at time n may be supplied to the delay circuit 380 to generate a delayed output. The delayed comparator output (e.g., comparator output at time n−1) and the current comparator output (e.g., comparator output at time n) may be supplied to the XOR gate 382. The XOR gate 382 may compare the current comparator output (e.g., comparator output at time n) to the delayed comparator output (e.g., comparator output at time n−1) to generate a trigger signal. If the XOR gate 382 outputs a 1, a trigger signal may be generated to enable operation of the ADC (e.g., 302). Conversely, if the if a XOR gate 382 outputs a 0, a trigger signal may not be generated and the ADC (e.g., 302) operation or bus traffic related to the input signal may be disabled.

Figure 8:
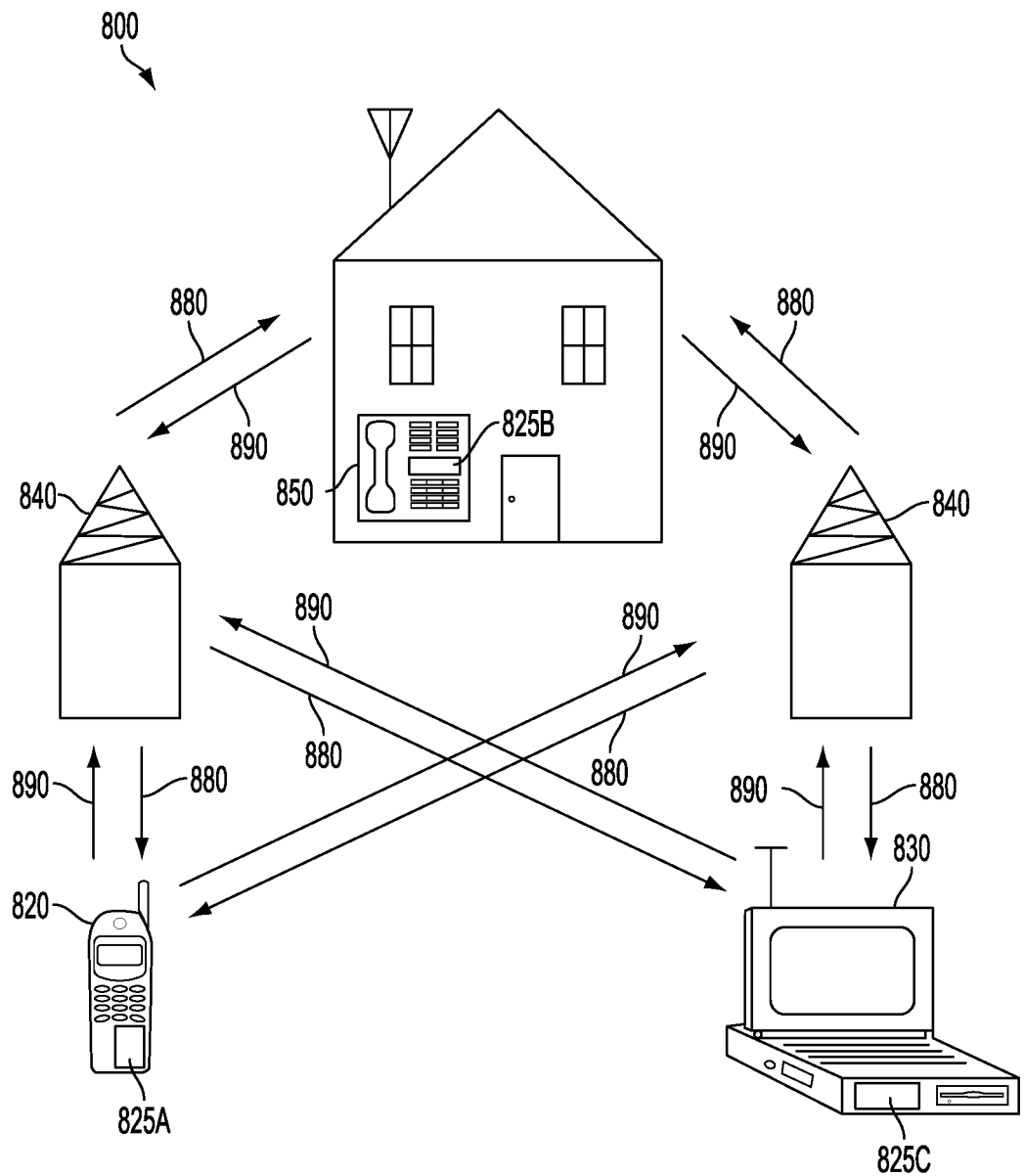
FIG. 8 is a block diagram showing an exemplary wireless communications system in which a configuration of the present disclosure may be advantageously employed.

FIG. 8 is a block diagram showing an exemplary wireless communications system 8, in which an aspect of the present disclosure may be advantageously employed. For purposes of illustration, FIG. 8 shows three remote units 820, 830, and 850, and two base stations 840. It will be recognized that wireless communications systems may have many more remote units and base stations. Remote units 820, 830, and 850 include integrated circuit (IC) devices 825A, 825B, and 825C that include the disclosed bus traffic reduction system. It will be recognized that other devices may also include the disclosed bus traffic reduction system such as the base stations, switching devices, and network equipment. FIG. 8 shows forward link signals 880 from the base stations 840 to the remote units 820, 830, and 850, and reverse link signals 890 from the remote units 820, 830, and 850 to the base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 8 illustrates remote units according to the aspects of the present disclosure, the disclosure is not limited to these exemplary illustrated units. Aspects of the present disclosure may be suitably employed in many devices, which include the disclosed bus traffic reduction system.

Figure 9:
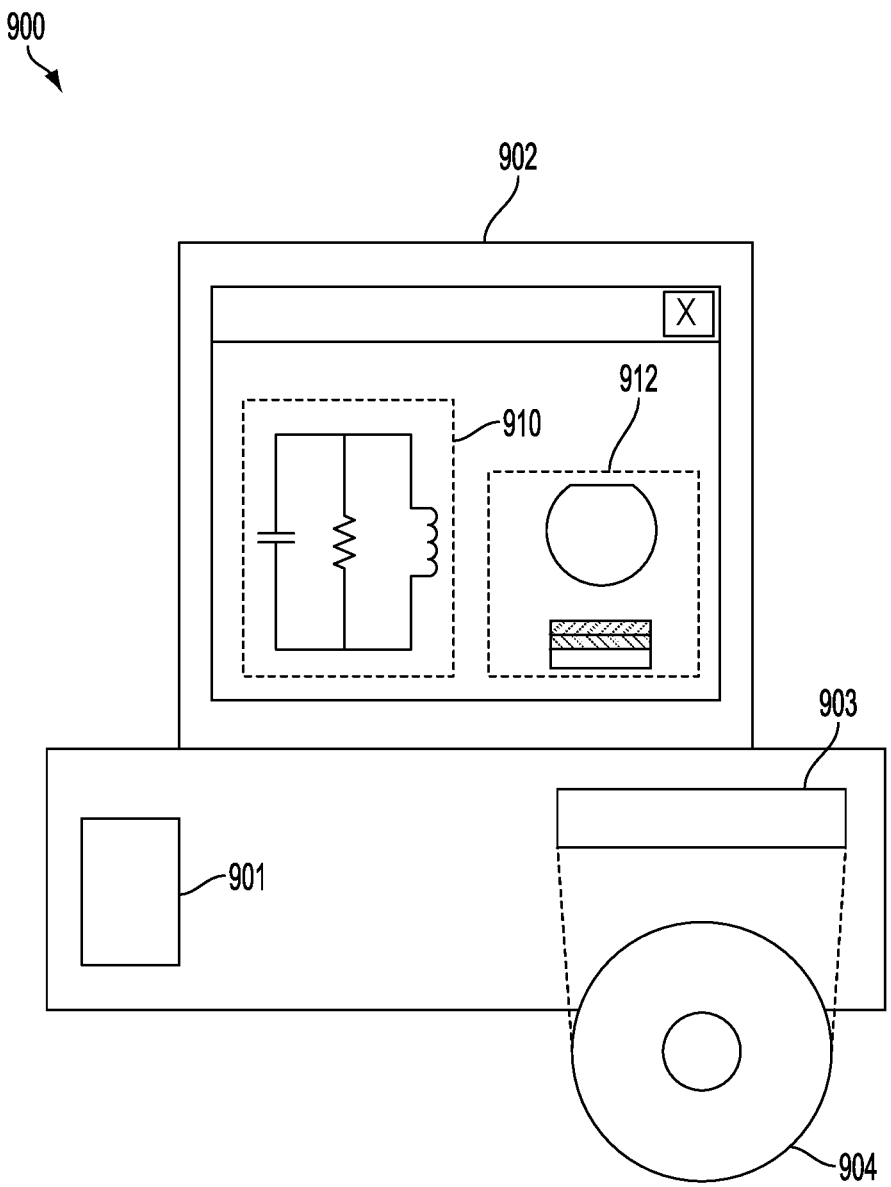
FIG. 9 is a block diagram illustrating a design workstation used for circuit, layout, and logic design of components, in accordance with various aspects of the present disclosure.

FIG. 9 is a block diagram illustrating a design workstation 900 used for circuit, layout, and logic design of a semiconductor component, such as the PDM 300 disclosed above. The design workstation 900 includes a hard disk 901 containing operating system software, support files, and design software such as Cadence or OrCAD. The design workstation 900 also includes a display 902 to facilitate design of a circuit 910 or a semiconductor component 912, such as the PDM 300. A storage medium 904 is provided for tangibly storing the design of the circuit 910 or the semiconductor component 912 (e.g., the PDM 300). The design of the circuit 910 or the semiconductor component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the semiconductor component 912 by decreasing the number of processes for designing semiconductor wafers.

Implementation examples are provided in the following number clauses.

1. A processor-implemented method, comprising:
   receiving a mixed signal in a computing device including a system-on-a-chip (SoC);
   detecting one or more polarity changes of a slope of a waveform corresponding to the mixed signal; and
   selectively disabling one or more of an analog-to-digital converter (ADC) or at least a portion of SoC bus traffic related to ADC operation between one or more polarity changes in the slope of the waveform.

2. The processor-implemented method of clause 1, further comprising enabling the SoC bus traffic related to the ADC operation at an occurrence of one of a peak or a dip in the waveform corresponding to the mixed signal.

3. The processor-implemented method of clause 1 or 2, wherein the mixed signal comprises a power supply signal, a sensor signal, a reference voltage signal, a reference current signal, a transmit power level, a battery level, or a SoC temperature.

4. The processor-implemented method of any of clauses 1-3, in which all of the SoC bus traffic related to the ADC operation is disabled between the one or more polarity changes in the slope of the waveform.

5. The processor-implemented method of any of clauses 1-4, further comprising disabling an analog-to-digital conversion for at least one device between the one or more polarity changes in the slope of the waveform.

6. The processor-implemented method of any of clauses 1-5, in which the processor-implemented method is implemented in an automotive application.

7. The processor-implemented method of any of clauses 1-6, in which the processor-implemented method is implemented in a mobile device.

8. A system for mixed signal management, comprising:
   a detection device for detecting one or more polarity changes in a slope of a waveform corresponding to one or more mixed signal in a computing device including a system-on-a-chip (SoC); and
   a mixed signal controller for controlling SoC bus traffic or an analog-to-digital converter (ADC) based on the one or more polarity changes of the slope of the waveform corresponding to one or more mixed signals.

9. The system of clause 8, wherein the mixed signal controller enables the SoC bus traffic or ADC operation related to the one or more mixed signal at an occurrence of one of a peak or a dip in the waveform corresponding to the mixed signal.

10. The system of clause 8 or 9, wherein the mixed signal comprises a power supply signal, a sensor signal, a reference voltage signal, a reference current signal, a transmit power level, a battery level, or a SoC temperature.

11. The system of any of clauses 8-10, wherein the mixed signal controller disables one or more of the SoC bus traffic related to the mixed signal or ADC operation related to the mixed signal between the one or more polarity changes of the slope of the waveform corresponding to the one or more mixed signals.

12. The system of any of clauses 8-11, further comprising disabling an analog-to-digital conversion for at least one device between the one or more polarity changes in the slope of the waveform.

13. The system of any of clauses 8-12, implemented in an automotive application.

14. The system of any of clauses 8-13, implemented in a mobile device.

15. An apparatus, comprising:
   means for receiving a mixed signal in a computing device including a system-on-a-chip (SoC);
   means for determining whether a polarity of a slope of a waveform corresponding to the mixed signal has changed; and
   means for selectively disabling one or more of an analog-to-digital converter (ADC) or at least a portion of SoC bus traffic related to ADC operation between one or more changes in the polarity of the slope of the waveform.

16. The apparatus of clause 15, further comprising means for enabling the SoC bus traffic related to the ADC operation at an occurrence of one of a peak or a dip in the waveform corresponding to the mixed signal.

17. The apparatus of clause 15 or 16, wherein the mixed signal comprises a power supply signal, a sensor signal, a reference voltage signal, a reference current signal, a transmit power level, a battery level, or a SoC temperature.

18. The apparatus of any of clauses 15-17, further comprising means for disabling the SoC bus traffic related to the ADC operation between the one or more changes in the polarity of the slope of the waveform.

19. The apparatus of any of clauses 15-18, further comprising means for disabling ADC operation for at least one device between the one or more changes in the polarity of the slope of the waveform.

20. The apparatus of any of clauses 15-19, wherein the apparatus is included in an automotive application.

21. The apparatus of any of clauses 15-20, wherein the apparatus is included in a mobile device.

22. A non-transitory computer-readable medium having program code recorded thereon, the program code executed by a processor and comprising:
program code to receive a mixed signal in a computing device including a system-on-a-chip (SoC);
program code to detect one or more polarity changes of a slope of a waveform corresponding to the mixed signal; and
program code to selectively disable one or more of an analog-to-digital converter (ADC) or at least a portion of SoC bus traffic related to ADC operation between one or more polarity changes in the slope of the waveform.

23. The non-transitory computer-readable medium of clause 22, wherein the program code comprises program code to enable the SoC bus traffic related to the ADC operation at an occurrence of one of a peak or a dip in the waveform corresponding to the mixed signal.

24. The non-transitory computer-readable medium of clause 22 or 23, wherein the mixed signal comprises a power supply signal, a sensor signal, a reference voltage signal, a reference current signal, a transmit power level, a battery level, or a SoC temperature.

25. The non-transitory computer-readable medium of any of clauses 22-24, wherein the program code comprises program code to disable the SoC bus traffic related to the ADC operation between the one or more polarity changes in the slope of the waveform.

26. The non-transitory computer-readable medium of any of clauses 22-25, wherein the program code comprises program code to disable an analog-to-digital conversion for at least one device between the one or more polarity changes in the slope of the waveform.

27. The non-transitory computer-readable medium of any of clauses 22-26, wherein the program code is implemented in an automotive application.

28. The non-transitory computer-readable medium of clause 22, wherein the program code is implemented in a mobile device.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random access memory (RAM), read-only memory (ROM), electrically erasable read-only memory (EEPROM), compact disc read-only memory (CD-ROM) or other optical disk storage, magnetic disk storage or other magnetic storage devices, or other medium that can be used to store desired program code in the form of instructions or data structures and that can be accessed by a computer. Disk and disc, as used, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above, and below may refer to sides of a substrate or electronic device. Moreover, the scope of the present disclosure is not intended to be limited to the particular configurations of the process, machine, manufacture, composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, erasable programmable read-only memory (EPROM), EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the present disclosure is provided to enable any person skilled in the art to make or use the present disclosure. Various modifications to the disclosure will be readily apparent to those skilled in the art, and the generic principles defined may be applied to other variations without departing from the spirit or scope of the disclosure. Thus, the present disclosure is not intended to be limited to the examples and designs described, but is to be accorded the widest scope consistent with the principles and novel features disclosed.

What is claimed is:

1. A processor-implemented method, comprising:
   receiving a mixed signal in a computing device including a system-on-a-chip (SoC);
   detecting one or more polarity changes of a slope of a waveform corresponding to the mixed signal; and
   selectively disabling one or more of an analog-to-digital converter (ADC) or at least a portion of SoC bus traffic related to ADC operation between one or more polarity changes in the slope of the waveform.

2. The processor-implemented method of claim 1, further comprising enabling the SoC bus traffic related to the ADC operation at an occurrence of one of a peak or a dip in the waveform corresponding to the mixed signal.

3. The processor-implemented method of claim 1, wherein the mixed signal comprises a power supply signal, a sensor signal, a reference voltage signal, a reference current signal, a transmit power level, a battery level, or a SoC temperature.

4. The processor-implemented method of claim 1, wherein the SoC bus traffic related to the ADC operation is disabled between the one or more polarity changes in the slope of the waveform.

5. The processor-implemented method of claim 1, further comprising disabling an analog-to-digital conversion for at least one device between the one or more polarity changes in the slope of the waveform.

6. The processor-implemented method of claim 1, wherein the processor-implemented method is implemented in an automotive application.

7. The processor-implemented method of claim 1, wherein the processor-implemented method is implemented in a mobile device.

8. A system for mixed signal management, comprising:
   a detection device for detecting one or more polarity changes in a slope of a waveform corresponding to one or more mixed signal in a computing device including a system-on-a-chip (SoC); and
   a mixed signal controller for controlling SoC bus traffic or an analog-to-digital converter (ADC) based on the one or more polarity changes of the slope of the waveform corresponding to one or more mixed signals.

9. The system of claim 8, wherein the mixed signal controller enables the SoC bus traffic or ADC operation related to the one or more mixed signal at an occurrence of one of a peak or a dip in the waveform corresponding to the mixed signal.

10. The system of claim 8, wherein the mixed signal comprises a power supply signal, a sensor signal, a reference voltage signal, a reference current signal, a transmit power level, a battery level, or a SoC temperature.

11. The system of claim 8, wherein the mixed signal controller disables one or more of the SoC bus traffic related to the mixed signal or ADC operation related to the mixed signal between the one or more polarity changes of the slope of the waveform corresponding to the one or more mixed signals.

12. The system of claim 8, further comprising disabling an analog-to-digital conversion for at least one device between the one or more polarity changes in the slope of the waveform.

13. The system of claim 8, implemented in an automotive application.

14. The system of claim 8, implemented in a mobile device.

15. An apparatus, comprising:
   means for receiving a mixed signal in a computing device including a system-on-a-chip (SoC);
   means for determining whether a polarity of a slope of a waveform corresponding to the mixed signal has changed; and
   means for selectively disabling one or more of an analog-to-digital converter (ADC) or at least a portion of SoC bus traffic related to ADC operation between one or more changes in the polarity of the slope of the waveform.

16. The apparatus of claim 15, further comprising means for enabling the SoC bus traffic related to the ADC operation at an occurrence of one of a peak or a dip in the waveform corresponding to the mixed signal.

17. The apparatus of claim 15, wherein the mixed signal comprises a power supply signal, a sensor signal, a reference voltage signal, a reference current signal, a transmit power level, a battery level, or a SoC temperature.

18. The apparatus of claim 15, further comprising means for disabling the SoC bus traffic related to the ADC operation between the one or more changes in the polarity of the slope of the waveform.

19. The apparatus of claim 15, further comprising means for disabling ADC operation for at least one device between the one or more changes in the polarity of the slope of the waveform.

20. The apparatus of claim 15, wherein the apparatus is included in an automotive application.

21. The apparatus of claim 15, wherein the apparatus is included in a mobile device.

22. A non-transitory computer-readable medium having program code recorded thereon, the program code executed by a processor and comprising:
   program code to receive a mixed signal in a computing device including a system-on-a-chip (SoC);
   program code to detect one or more polarity changes of a slope of a waveform corresponding to the mixed signal; and
   program code to selectively disable one or more of an analog-to-digital converter (ADC) or at least a portion of SoC bus traffic related to ADC operation between one or more polarity changes in the slope of the waveform.

23. The non-transitory computer-readable medium of claim 22, wherein the program code comprises program code to enable the SoC bus traffic related to the ADC operation at an occurrence of one of a peak or a dip in the waveform corresponding to the mixed signal.

24. The non-transitory computer-readable medium of claim 22, wherein the mixed signal comprises a power supply signal, a sensor signal, a reference voltage signal, a reference current signal, a transmit power level, a battery level, or a SoC temperature.

25. The non-transitory computer-readable medium of claim 22, wherein the program code comprises program code to disable the SoC bus traffic related to the ADC operation between the one or more polarity changes in the slope of the waveform.

26. The non-transitory computer-readable medium of claim 22, wherein the program code comprises program code to disable an analog-to-digital conversion for at least one device between the one or more polarity changes in the slope of the waveform.

27. The non-transitory computer-readable medium of claim 22, wherein the program code is implemented in an automotive application.

28. The non-transitory computer-readable medium of claim 22, wherein the program code is implemented in a mobile device.

* * * * *